United States Patent
Camarda et al.

(10) Patent No.: US 12,278,270 B2
(45) Date of Patent: Apr. 15, 2025

(54) METHODS OF MANUFACTURING SEMICONDUCTOR DEVICES

(71) Applicant: ETH Zuerich, Zurich (CH)

(72) Inventors: Massimo Camarda, Mascalucia (IT); Ulrike Grossner, Villigen (CH)

(73) Assignee: ETH Zuerich, Zurich (CH)

( * ) Notice: Subject to any disclaimer, the term of this patent is extended or adjusted under 35 U.S.C. 154(b) by 440 days.

(21) Appl. No.: 17/776,311

(22) PCT Filed: Nov. 5, 2020

(86) PCT No.: PCT/EP2020/081051
§ 371 (c)(1),
(2) Date: May 12, 2022

(87) PCT Pub. No.: WO2021/094176
PCT Pub. Date: May 20, 2021

(65) Prior Publication Data
US 2022/0399442 A1    Dec. 15, 2022

(30) Foreign Application Priority Data
Nov. 12, 2019 (EP) .................... 19208585

(51) Int. Cl.
*H01L 29/16* (2006.01)
*H01L 21/3065* (2006.01)
(Continued)

(52) U.S. Cl.
CPC ...... *H01L 29/1608* (2013.01); *H01L 21/3065* (2013.01); *H01L 29/0657* (2013.01);
(Continued)

(58) Field of Classification Search
CPC ............. H01L 29/1608; H01L 21/3065; H01L 29/0657; H01L 29/1606; H01L 29/2003;
(Continued)

(56) References Cited

U.S. PATENT DOCUMENTS 5,770,336 A * 6/1998 Choi ................. H01L 21/0277
430/5
6,306,773 B1  10/2001 Adas et al.
(Continued)

OTHER PUBLICATIONS

Dahal, Rajendra et al: "Fabrication of Thick Free-Standing Lightly-Doped n-Type 4H-SiC Wafers", Materials Science Forum, vol. 897, pp. 379-382, XP055500219, DOI: 10.4028/www.scientific.net/MSF.897.379; 2017.
(Continued)

*Primary Examiner* — Eduardo A Rodela
(74) *Attorney, Agent, or Firm* — Laurence A. Greenberg; Werner H. Stemer; Ralph E. Locher

(57) ABSTRACT

A method forms a part of a power semiconductor device. The method includes homoepitaxially forming two silicon carbide layers on a first side of a silicon carbide substrate and forming a pattern of pits on a second side of the silicon carbide substrate. The two layers include a buffer layer, on the first side of the silicon carbide substrate, and have a same doping type of the silicon carbide substrate and a doping concentration equal to or greater than $10^{17}$ cm$^{-3}$ in order to increase the quality of at least one subsequent SiC layer. The two layers include an etch stopper layer, being deposited on the buffer layer and has a same doping type as the buffer layer but a lower doping concentration in order to block a trenching process. The pattern of pits, obtained by electrochemical etching, extends completely thorough the silicon carbide substrate and the buffer layer.

20 Claims, 9 Drawing Sheets

(51) Int. Cl.
*H01L 29/06* (2006.01)
*H01L 29/20* (2006.01)
*H01L 29/66* (2006.01)
*H01L 29/872* (2006.01)

(52) U.S. Cl.
CPC ...... *H01L 29/1606* (2013.01); *H01L 29/2003* (2013.01); *H01L 29/66053* (2013.01); *H01L 29/872* (2013.01); *H01L 29/66431* (2013.01)

(58) Field of Classification Search
CPC ............. H01L 29/66053; H01L 29/872; H01L 29/66431; H01L 29/66325; H01L 29/66333; H01L 29/6634; H01L 29/7393; H01L 29/7395; H01L 29/7396; H01L 29/66712; H01L 29/7802
See application file for complete search history.

(56) References Cited

U.S. PATENT DOCUMENTS

| | | | | |
|---|---|---|---|---|
| 7,541,640 | B2* | 6/2009 | Brar | ...................... H01L 29/872 |
| | | | | 257/329 |
| 9,166,048 | B2* | 10/2015 | Simin | .................. H01L 29/6609 |
| 9,656,859 | B2* | 5/2017 | Meyer | .................. B81C 1/00539 |
| 9,780,206 | B2* | 10/2017 | Cooper, Jr. | ......... H01L 21/0475 |
| 10,985,285 | B2* | 4/2021 | Yonkee | ............... H01L 21/0254 |
| 11,411,099 | B2* | 8/2022 | Pu | ....................... H01L 29/0882 |
| 2007/0200116 | A1 | 8/2007 | Harris et al. | |
| 2017/0025530 | A1 | 1/2017 | Cooper, Jr. | |

OTHER PUBLICATIONS

Shor, J. S. et al.; "Dopant.-selective etch stops in 6H and 3C SiC", Journal of Applied Physics, American Institute of Physics, vol. 81, No. 3, pp. 1546, XP012041542, ISSN: 0021-8979, DOI: 10.1063/1.363890; 1997.

* cited by examiner

METHODS OF MANUFACTURING SEMICONDUCTOR DEVICES

FIELD AND BACKGROUND OF THE INVENTION

The present invention relates to a method and device structures for improved electronic devices based on silicon carbide substrates.

The present invention generally relates to semiconductor and graphene-based devices. More particularly, this invention relates to silicon carbide (SiC), Gallium Nitride (GaN) and Graphene (Gr) electronic devices and methods of making them.

SiC substrates are rapidly improving in wafer size, quality and costs. These substrates allow for the high-quality homo- and hetero-epitaxial chemical vapor deposition of doping-controlled layers for the fabrication of e.g. MOSFETs, HEMTs or sensors.

As a specific example, SiC power switching devices such as Schottky diodes and MOS transistors (MOSFETs) are in commercial production at various companies around the world and are increasingly making their way into systems. Accordingly, there is an ongoing desire for methods and novel structures which contribute improving their performances and to reduce their manufacturing costs.

SUMMARY OF THE INVENTION

It is therefore the objective of the present invention to provide a method for the realization of electronic devices with superior electronic behaviors at lower manufacturing cost.

This objective is achieved according to the present invention by a method of forming at least a part of an electrical device, the method comprising the steps of:

a) forming at least two silicon carbide layers on a first side of a silicon carbide substrate;

b) forming a pattern of pits on a second side of the silicon carbide substrate;

c) wherein the at least two layers comprising a first layer, hereinafter referred to as "buffer layer", on the first side of the silicon carbide substrate having the same doping type of the silicon carbide substrate and a doping concentration equal or greater than $10^{17}$ cm$^{-3}$ in order to increase the quality of at least one subsequent SiC layer; and d) wherein the at least two layers comprising a second layer, hereinafter referred to as "etch stopper layer", being deposited on the buffer layer and having the same doping type of buffer layer but a lower doping concentration in order to block a trenching process; and e) wherein the pattern of pits, obtained by electrochemical etching, extends completely thorough at least the silicon carbide substrate and the buffer layer.

Further, this objective is achieved according to the present invention by a method of forming at least a part of a power semiconductor device, the method comprising:

a) homoepitaxially forming at least one Nitride-containing layer on-top of a Silicon Carbide substrate on a first side of the silicon carbide substrate;

b) forming a pattern of pits on a second side of the silicon carbide substrate by means of an electrochemical etching process;

c) wherein the pattern of pits extends at least completely thorough the silicon carbide substrate and whereas the electrochemical etching process is blocked at the first Nitride-containing layer thanks to the holes barrier height generated at the SiC to Nitride-containing layer heterojunction.

The basic embodiments of the present invention provide improvements to state of the art of power semiconductor devices by providing designs that employ a set of Silicon Carbide doped epitaxies to selectively dissolve regions of the SiC substrate, i.e. generate a pattern of vias or pits, to improve the performances, e.g. reduce the specific on-resistance, of the semiconductor based devices. It has to be noted that further functional layers, such as a source or a gate, can be on top of the "Nitride containing layer", which could be understood as "in direct contact", such as a layer structure e.g. SiC/GaN/Source, or as with some further layers in between, e.g. such as a layered multilayer structure SiC/AlN/GaN/AlN/AlGaN/Source.

Further preferred embodiments of the present invention are listed in the dependent claims.

Preferred embodiments of the present invention are hereinafter described in more detail with reference to the attached drawings which depict in:

DETAILED DESCRIPTION OF THE INVENTION

Figure 1A:
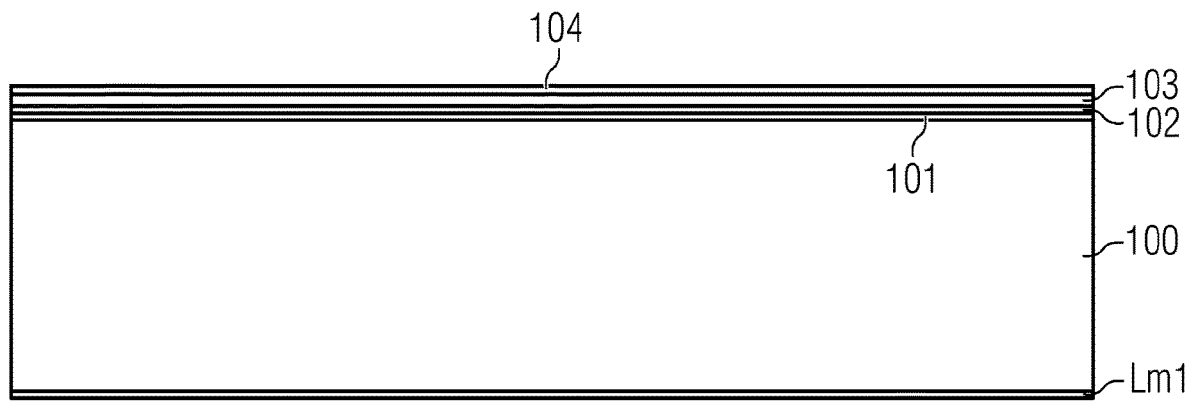
FIG. 1 an exemplary method of fabricating a power semiconductor device in the form of a SiC Schottky diode that incorporates the different epitaxial layers and the pit structure of the invention.

In the following specification the following terminologies and acronyms are used:

PVD and CVD growth: Physical Vapor Deposition (PVD) defines a process in which the material goes from a condensed phase to a vapor phase and then back to a, typically, thin film condensed phase. The most common PVD processes are sputtering and evaporation. All SiC conductive substrates (<20 mΩcm) as well as most of the semi-insulating ones (>1MΩ·cm) are grown by PVD. In Chemical Vapor Deposition (CVD) the wafer (substrate) is exposed to one or more volatile precursors which react and/or decompose, thus undergo chemical reactions in the gas phase, finally depositing on the substrate surface to produce the desired thin layer. CVD of SiC layers allows for precise control of both doping and thickness on large, currently 8-inch, areas. All electrically active areas of SiC and GaN devices are obtained by CVD processes.

Silicon Carbide substrate: High quality single crystalline Silicon carbide wafer with either medium-high n-type conductivity (<20 mΩcm) or semi-insulating (>1MΩ·cm) properties. Obtained by PVD growth processes.

Homoepitaxial layer: Homoepitaxy refers to the ordered (epitaxial) deposition of a crystalline over layer on a crystalline substrate, where the over layer has the same atomic elements and atomic structure of the substrate, e.g. 4H-SiC on 4H-SiC wafers. This technology is used to grow a film which is purer than the substrate and to fabricate layers having different doping type and doping concentrations.

Heteroepitaxial layer: Heteroepitaxy refers to the ordered (epitaxial) deposition of a crystalline over layer on a crystalline substrate, where the over layer is a different from the substrate, e.g. 2H-GaN, AlN, 3C-SiC on 4H-SiC wafers.

MOSFET: The metal-oxide-semiconductor field-effect transistor (MOSFET) is a type of field-effect transistor that is fabricated by the controlled oxidation of a semiconductor, e.g. SiC or GaN or by the deposition of an insulator. It is characterized by an insulated gate, whose electric bias determines the conductivity of the device. This ability to change conductivity with small changes of the gate voltage can be used for amplifying or switching electronic signals.

IGBT: The insulated-gate bipolar transistor (IGBT) consists of four alternating layers (P-N-P-N) that are controlled by a metal-oxide-semiconductor (MOS) gate structure. In the specific case of SiC IGBT, the switching device contains a p+ SiC layer below the drift layer to act as a minority carriers injector on the drift layer in the on-state, this allows a reduction of the $R_{ON}$ resistance of the device.

HEMT: The High-electron-mobility transistor (HEMT) is a field-effect transistor incorporating a junction between two materials with different band gaps (i.e. a heterojunction) as the channel instead of a doped region (as is generally the case for MOSFET).

Electrochemical etching (ECE): Etching process that involves the use of a chemical solution containing some electrolyte, an anode, and a cathode. The process proceed by a set of redox reactions of the sample due to the induced electrical fields, followed by the dissolution of the reaction products by the electrolyte and/or desorption in the gas phase. In the case of semiconductors, the process can strongly depend on the doping type, concentration and heterojunctions.

Photo-electrochemical etching (P-ECE): similar to ECE, but also including generation of free electrical carrier by a ionizing light source, which enhances the redox reactions on the sample through the generation of electron-holes free carriers. The process critically depends on the energy of the ionizing light, so that it can be used to perform bandgap-selective PEC etching to e.g. selectively remove 4H-SiC (bandgap 3.2 eV) while preserving the GaN (bandgap 3.4 eV) or AlN (bandgap 6 eV) layers such as in U.S. Pat. No. 6,884,740 B2.

RIE: Reactive Ion Etching (RIE) uses chemically reactive plasma to dissolve portions of material. The plasma is generated under low pressure (vacuum) by an electromagnetic field. High-energy ions from the plasma attack the sample surface and react with it generating volatile species which are then removed by the gas flow.

The preferred embodiments of the present invention hereinafter described provide significant improvements to state of the art power semiconductor devices by providing designs that employ a set of Silicon Carbide doped epitaxies, or the presence of specific heterojunctions, to selectively dissolve regions of the SiC substrate, i.e. generate a pattern of vias or pits, to improve the performances, e.g. reduce the specific on-resistance, of the semiconductor based devices.

One main embodiment of the present invention is a semiconductor device that includes a SiC substrate and at least two homo-epitaxial layers formed thereon, a first layer having the same doping type of the substrate and equivalent or higher impurity concentration, and a second layer, having the same doping type of the substrate but lower impurity concentration. The silicon carbide substrate further has a pattern of vias or pits extending completely through at least the substrate and the first layer.

Examples of the embodiment may include:
  (i) SiC power devices: Schottky diodes, MOSFETs, and IGBTs.
  (ii) GaN HEMI for, e.g., telecommunications.
  (iii) SiC devices based on spin-active point like defects, e.g. isolated silicon vacancies or Molybdenum impurities, for sensing and telecommunications applications.
  (iv) Graphene freestanding membranes on SiC substrates The presence of the pattern of pits will provides either: a reduced on-state resistance in (i), a reduced substrate leakage or electronic interference in (ii and iv) or an enhanced spin-photon coupling in (iii).

Such features and advantages, as well as others, will become readily apparent to those of ordinary skill in the art by reference to the following detailed description and accompanying drawings.

During investigations leading to the present invention, performance limiting studies of various semiconductor devices suggested that the performance of such devices are limited, or even their functionality hampered, by the presence of the SiC substrate on which they are fabricated.

As a specific example, the specific on-resistance (or resistance-area product) $R_{ON}$ of state-of-the-art SiC power MOSFETs below 2,000V can be dominated by the substrate resistance $R_{SUB}$ (see e.g. U.S. Patent Application No. US 2017/025530 A1). $R_{ON}$ represents the most important measure of the device performance, since the device cost scales as the square root of $R_{ON}$ so that, if $R_{ON}$ could be reduced by e.g. a factor of four, the device cost may be reduced by a factor of two while delivering the same performance.

SiC substrates are typically about 400 µm thick with a resistivity larger than 15 mΩcm. Since it is not possible to reduce the resistivity below this value, it is necessary to reduce the thickness of the substrate to reduce its electrical resistance. When manufacturing SiC MOSFETs and similar devices, the substrate can be thinned as the last step in the fabrication process, but it is impractical to thin the substrate below 100 µm due to mechanical instabilities.

Consequently, there is a need for a way to reduce the substrate resistance below the value that can be achieved by mechanical wafer thinning.

According to aspects of the present invention, this goal can be achieved, without reducing the mechanical integrity of the substrate, by etching pits or vias along the whole substrate, in a regular pattern, and then filling the vias with Ohmic contacts.

FIG. 1 illustrates an exemplary method of fabricating a power semiconductor device in the form of a SiC Schottky diode 180. Referring to FIG. 1a, the initial structure has a silicon carbide substrate 100, a first homoepitaxial layer 101, a second homoepitaxial layer 102, a third homoepitaxial layer 103 and a fourth homoepitaxial layer 104 all formed on a first or upper surface of the silicon carbide substrate 100, the embodiment can also have a homoepitaxial layer Lm1 formed on the second, or lower, surface of the silicon carbide substrate 100. The silicon carbide substrate 100 is a highly doped n+ layer. The first layer 101 has the same doping type of the silicon carbide substrate 100 and a doping greater than the subsequent layer 102 to 104 so to act as buffer layer. The second layer 102 has the same doping type of the first layer 101 but lower concentration. The third layer 103 has the same doping type of the second layer 102 but higher concentration and finally the fourth layer 104 has the same doping type of the third layer 103 but lower concentration. The layer Lm1, if present, has a lower doping concentration than the substrate.

Referring to scientific papers [i, ii] the first layer 101, used as a "buffer layer", has generally a thickness of less than 10 μm and it is used to improve the crystal quality of the subsequent layers 102 to 104. The second layer is used as "etch-stopper" and has generally a thickness of less than 10 μm, preferentially less than 1 μm. The third layer 103 is used to improve the electrical contacts with the back Ohmic metallization and should have a thickness greater than 0.5 μm to compensate for etching non-uniformities (see FIG. 1c).

Finally, the fourth layer 104 is the "drift layer" of the SiC Schottky diode and should have a thickness in accordance with the targeted blocking voltage.

Figure 1B:
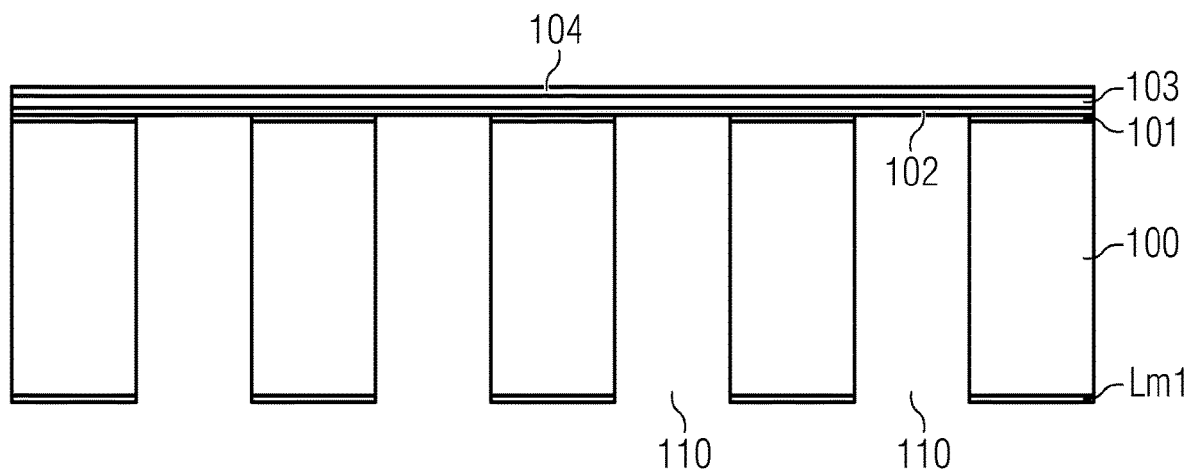

FIG. 1b shows a first intermediate fabrication step where a pattern of pits 110, initially generated by RIE in the layer Lm1, if present, is then extended thorough the full substrate and the layer 101 by mean of electrochemical etching. This technique allows a local selective full removal of the silicon carbide substrate 100 and the first layer 101, but it is blocked by the second etch stopper layer 102.

Figure 1C:
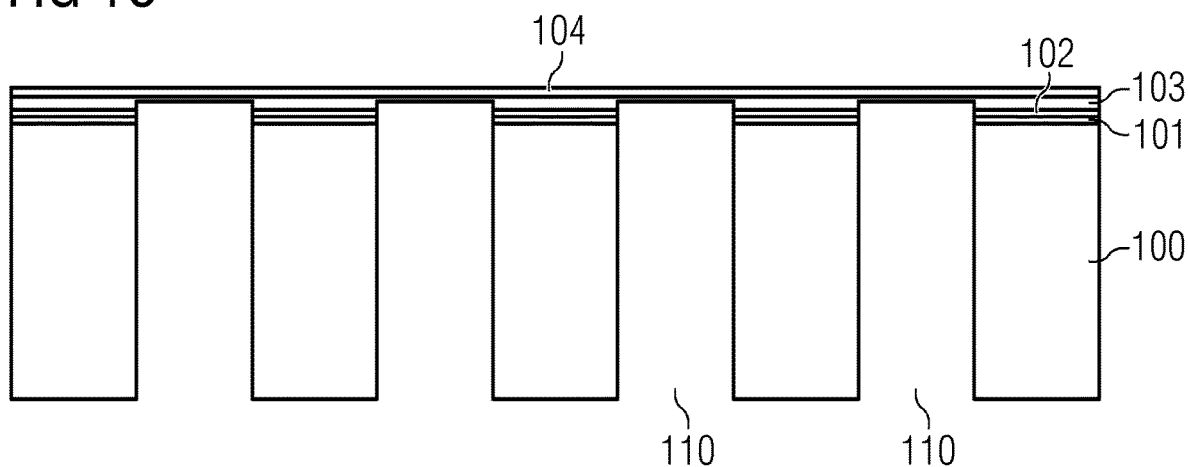

FIG. 1c shows a second intermediate fabrication step where the pattern of pits 110 is further etched by e.g. Reactive Ion Etching (RIE), which allows removal of the second layer 102 and the additional layer Lm1, if present, and direct back contact of the third layer 103.

Figure 1D:
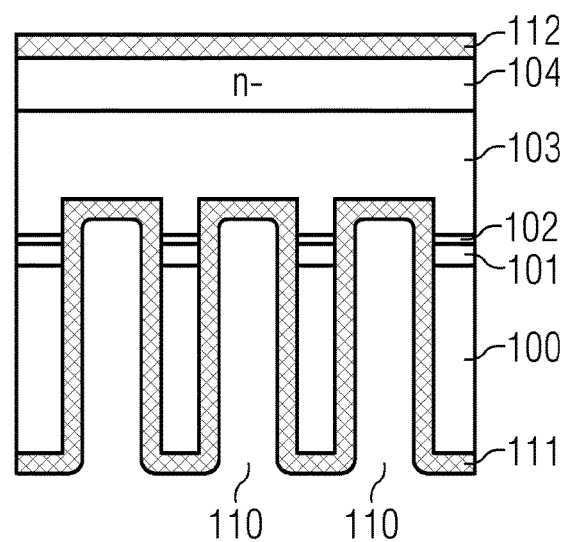
Figure 2A:
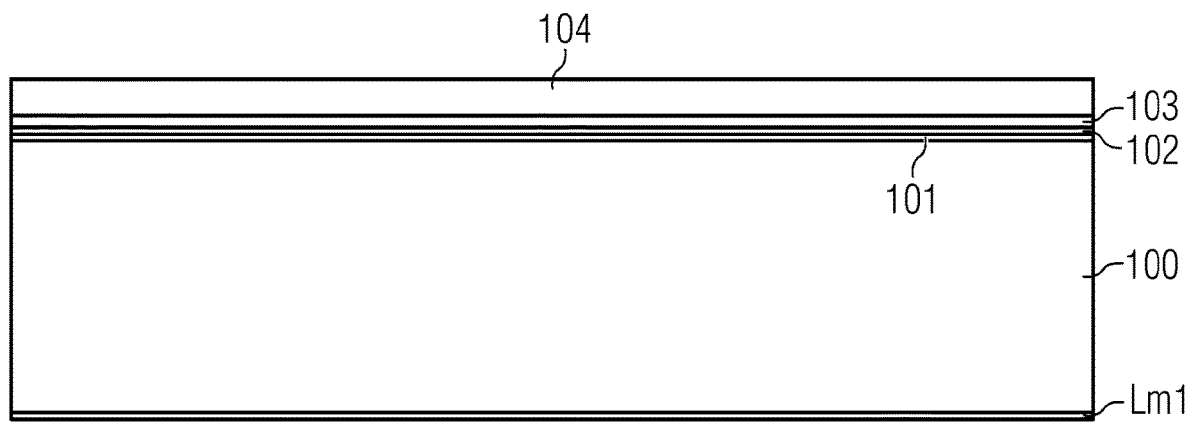
FIG. 2 an exemplary method of fabricating a power semiconductor device in the form of a MOSFET that incorporates the different epitaxial layers and the pit structure of the invention.
Figure 2B:
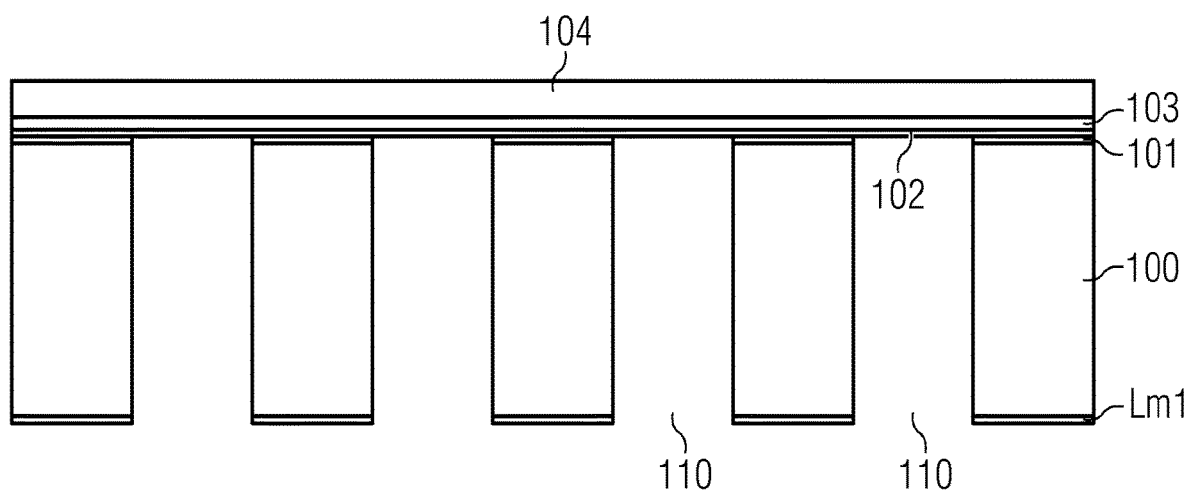
Figure 2C:
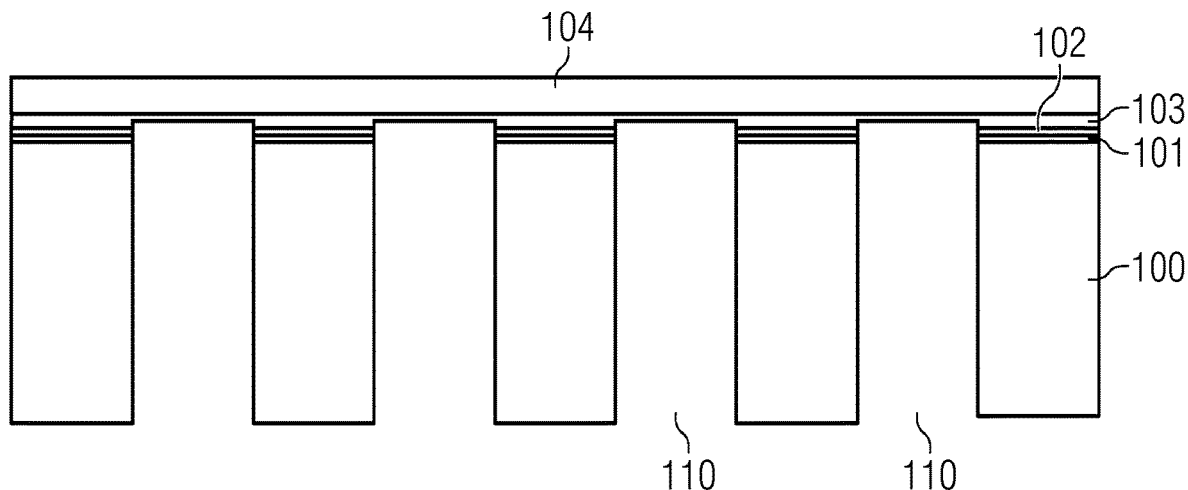
Figure 2D:
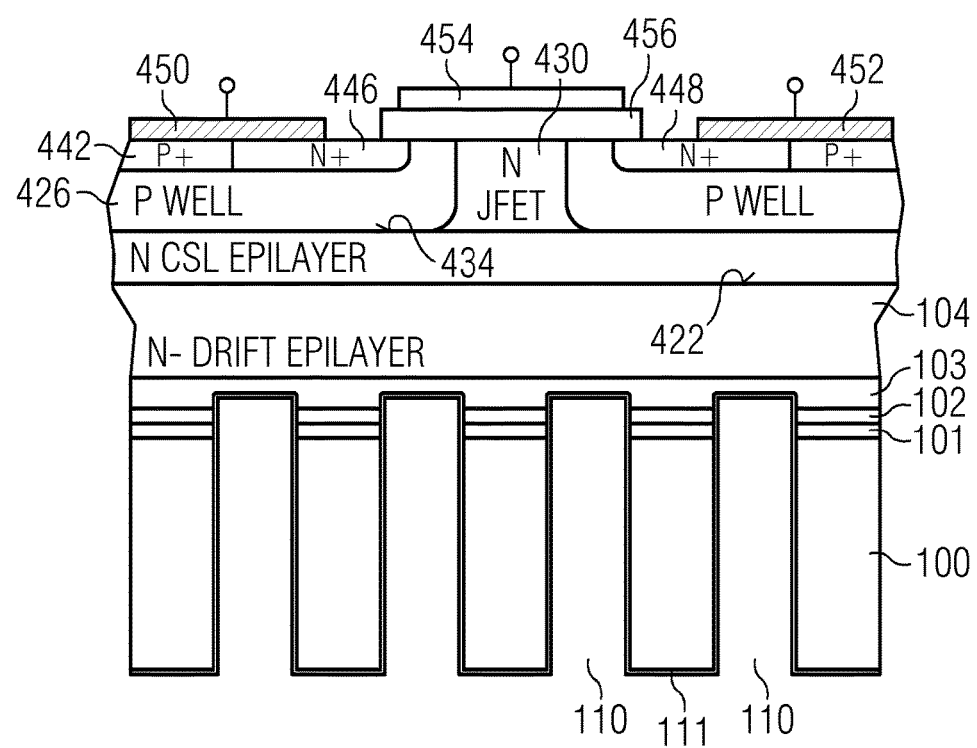

FIG. 1d shows the final fabrication step including a back Ohmic contact 111 and a front Schottky contact 112.

FIG. 2 shows an exemplary method of fabricating a power semiconductor device in the form of a MOSFET 220 that incorporates the different epitaxial layers and the pit structure of the present invention as already described with respect to FIG. 1. The layout and the fabrication of the first fabrication steps are the same as for the SiC Schottky diode 180 (FIG. 2b and FIG. 2c). The final fabrication steps, as shown in FIG. 2d, instead are substantially equivalent to the MOSFET device shown e.g. in FIG. 1 of U.S. Patent Publication No. 2006/0192256 or FIG. 4 of U.S. Patent Publication No. US 2017/025530A1. For that reason, reference signs 420 represents an N CSL epilayer, 426, 428 represent base regions; 430 is a JFET region; 434 is an interface between the N CSL epilayer 424 and the P Well base regions; 442, 444 are P+ source regions; 446, 448 are source regions; 446, 448 are source regions; 450, 452 are source contacts and 454 is a contact for a dielectric region 456.

However, it will be appreciated that corresponding elements of other MOSFET devices may be employed. In essence, the presented structure can have all elements of a standard vertical silicon carbide MOSFET with the benefit of the pits 110 extending throughout all the substrate, and through the first layer 101 and the second layer 102. The fabrication of the "standard" vertical SiC MOSFET is well known and may be carried out as described e.g. in U.S. Patent Publication No. 2006/0192256 A1.

In another embodiment, an insulated gate bipolar transistor (IGBT) having the pitted silicon carbide substrate can be realized. The layout and fabrication of the first fabrication steps is the same as the SiC Schottky diode 180, except that, in this case, the third layer 103 has a different doping type with respect to the second layer 102 and will act both as a back Ohmic contact "enhancer" as well as "minority carriers injector" to further reduce the $R_{ON}$ resistance of the power device. The final fabrication steps instead are substantially equivalent to e.g. the IGBT device shown in FIG. 1 of U.S. Pat. No. 4,364,073 A1.

In another different embodiment, an improved Gallium Nitride based device 320, having the pitted silicon carbide substrate to reduce switching losses and current leakage, can be realized. Referring to FIG. 3, the initial structure has the silicon carbide substrate 100, a first homoepitaxial layer 101 formed on a first or upper surface, a second homoepitaxial layer 102. The silicon carbide substrate 100 is a highly doped n+ layer. The first layer 101 has the same doping type of the silicon carbide substrate 100 and the second layer 102 has the same doping type of the first layer 101 but lower concentration.

Above the top-most SiC layer is then epitaxially grown an Aluminum Nitride (AlN) nucleation layer 120, a Gallium Nitride (GaN) buffer layer 121 an Aluminum Nitride (AlN) barrier layer 122 and finally an Aluminum gallium nitride (AlGaN) cap layer 123, to have the creation of a 2-dimensional electron gas (2DEG) at the GaN/AlGaN interface.

Figure 3A:
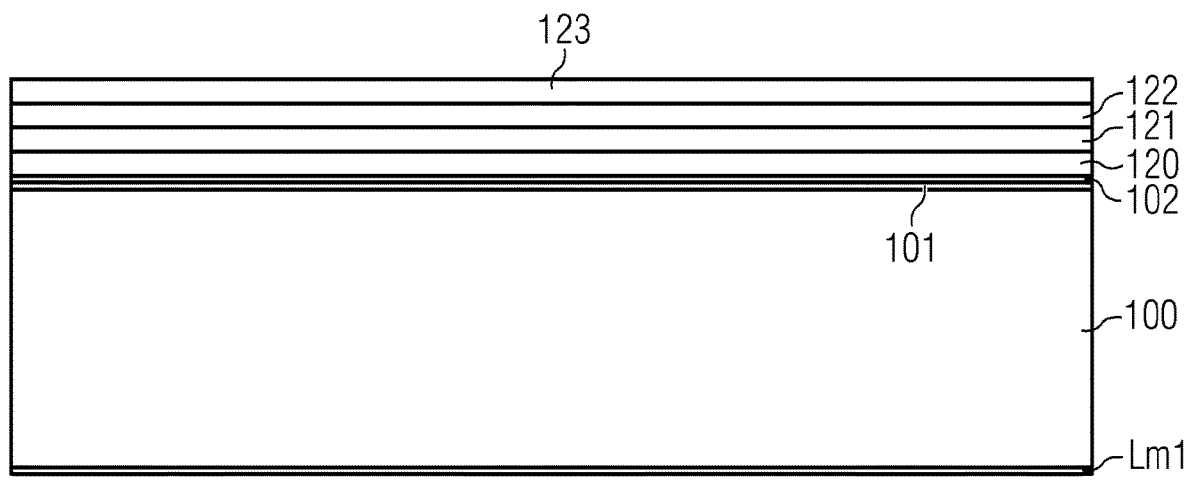
FIG. 3 an exemplary method of fabricating a power semiconductor device in the form of a GaN HEMI that incorporates the different epitaxial layers and the pit structure according to the invention.
Figure 3B:
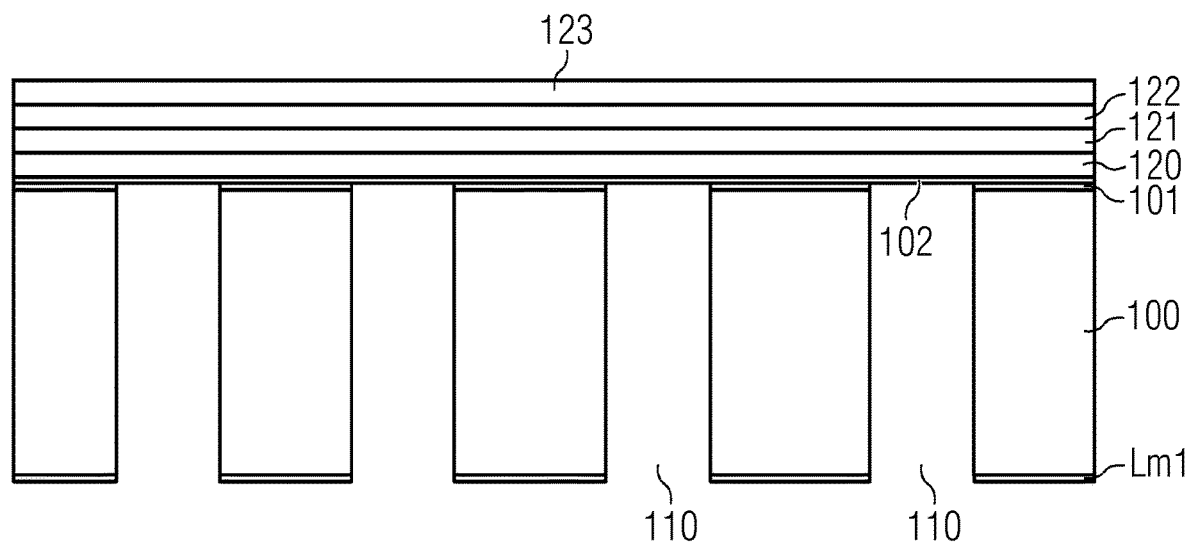
Figure 3C:
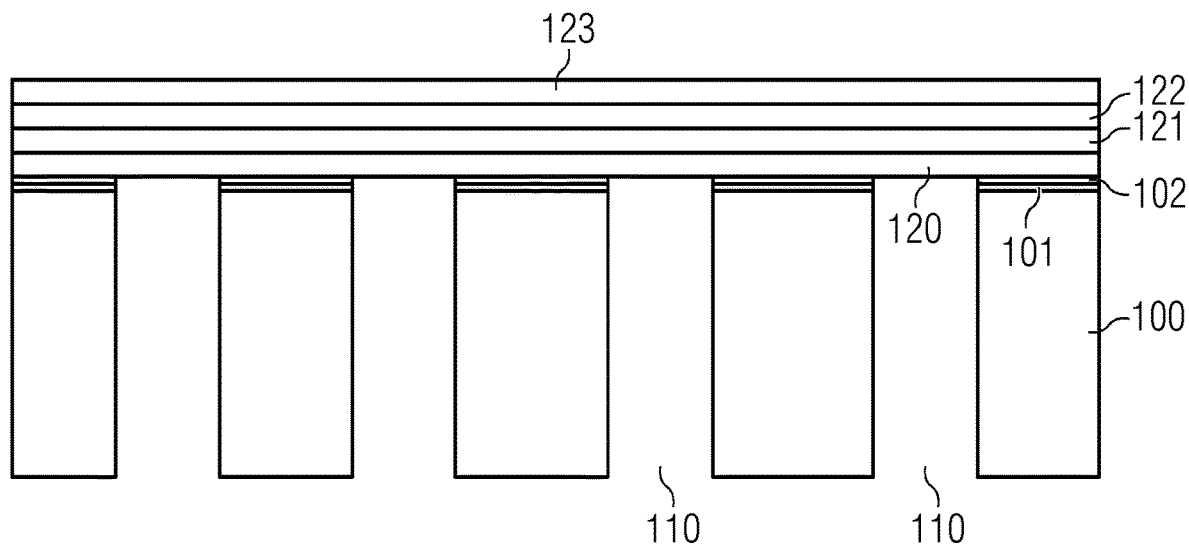
Figure 3D:
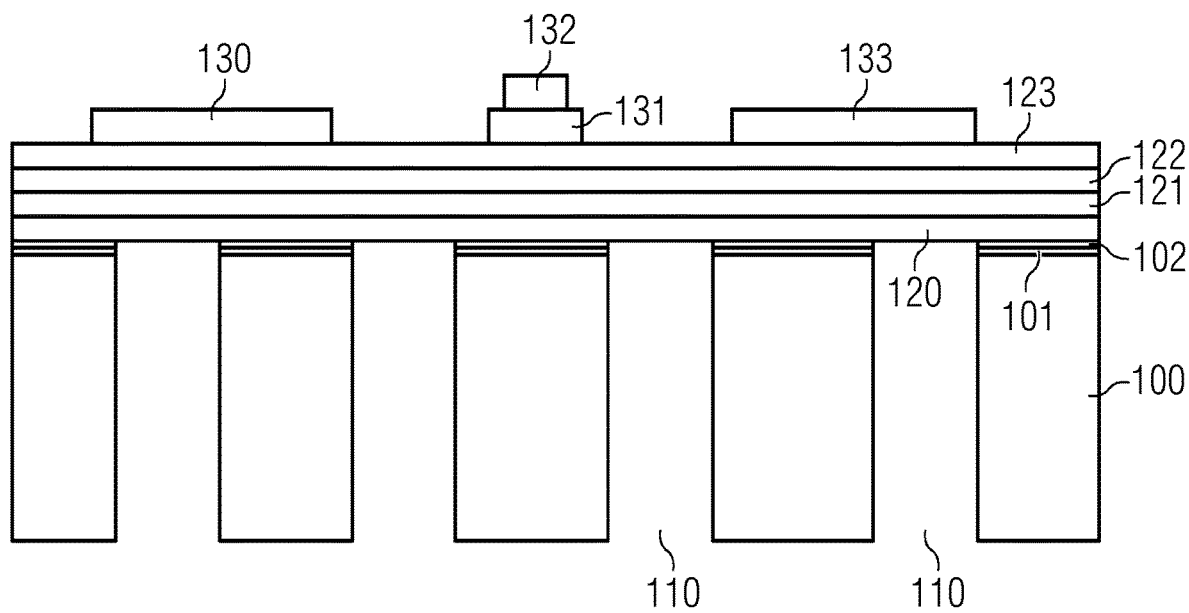

FIG. 3b shows a first intermediate fabrication step which, similarly to FIG. 1b, starts with the creation of pits 110, initially generated by RIE in the additional layer Lm1, if present, extending thorough the full silicon carbide substrate 100 and the first layer 101, but blocked by the etch stop layer 102. The pits 110 are then further extended through the second layer 102 by mean of either RIE, electrochemical, photo-electrochemical etching or a combination of them. FIG. 3d shows the final schematic GaN HEMT structure containing source contacts 130, a gate insulator 131, a gate contact 132 and a drain contact 133.

In yet another GaN based HEMT related embodiment, an improved Gallium Nitride based device 320, having the pitted silicon carbide substrate to reduce switching losses and currents leakage, can be realized. As compared to FIG. 3, in this solution the Aluminum Nitride (AlN) nucleation layer 120, the Gallium Nitride (GaN) buffer layer 121, the Aluminum Nitride (AlN) barrier layer 122 and the Aluminum gallium nitride (AlGaN) cap layer 123, are epitaxially grown directly on the silicon carbide substrate 100, without any epitaxial SiC layer in between. This solution relies on the possibility of stopping the electrochemical etching process thanks to the holes barrier heights generated at the SiC/AlN (~1.7 eV)[iv] or SiC/GaN (~0.8 eV)[v] heterojunctions, without the use, instead, of the SiC etch stopper layer 102. This solution has two important further benefits: (i) it reduces fabrication costs avoiding the need of SiC epitaxial layers and (ii) it allows using on-axis SiC substrates.

Furthermore, as compared to the PECE solutions presented, e.g. in U.S. Pat. No. 6,884,740B2, the herein proposed two solutions (i) avoid the use of optical excitation to generate the free carriers necessary for the redox reduction (thus permitting direct multi-wafer processing and increasing throughput) and (ii) allow for much higher SiC etching rates (further increasing throughput).

Note that other embodiments e.g. without the Aluminum Nitride (AlN) layers, with the use of further cap layers or with different HEMT structures can be envisaged. Note also that the structure of pits could be different from what presented in FIG. 3 to optimize e.g. for thermal heat dissipation through the SiC substrate while minimizing switching losses thanks to the pits distribution. Note finally that some pits through the substrate could further extend through some or all the Nitride layers as through-wafer slot vias, to achieve monolithic integration of the microwave circuits.

In essence, the presented structure can have all elements of a standard lateral GaN HEMT with the benefit of the pits 110 extending at least throughout all the substrate. The fabrication of the "standard" lateral GaN HEMT is well known and may be carried out as described e.g. in review paper [vi].

Figure 4A:
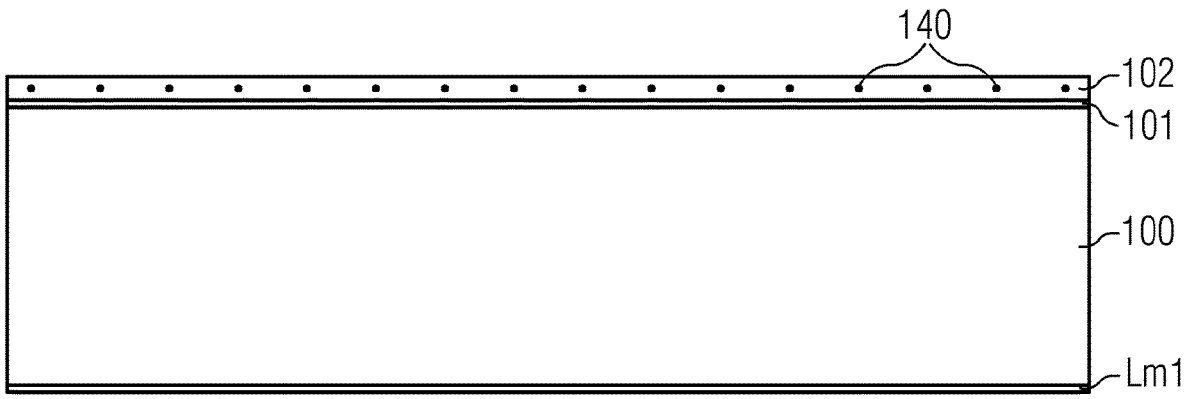
FIG. 4 an exemplary method of fabricating an improved SiC based sensor where the pit structure of the invention allows for enchantment of the optical emission rate of isolated point defects due to the Purcell effect.

In yet another embodiment, an improved SiC based sensor is realized. Referring to FIG. 4, the initial structure has the silicon carbide substrate 100, a first homoepitaxial layer 101 and at least a second homoepitaxial layer 102 formed on a first or upper surface, the embodiment can also have a homoepitaxial layer Lm1 formed on the second, or lower, surface of the silicon carbide substrate 100. The silicon carbide substrate 100 is a highly doped n+ layer. The first layer 101 has the same doping type of the substrate with, equal or higher, concentration and the second layer 102 a lower doping concentration with respect to the first layer. The additional layer Lm1, if present, has a lower concentration than the substrate 100.

The second layer 102 further contains isolated point defects 140 generated either during the epitaxial growth or after growth by implantation. The point defects can be e.g. silicon vacancies or transition metals localized impurities and should preferentially have a distance greater than 100 nm, to act as isolated spin systems. In this embodiment, the second layer 102 is used both as etch stop and to enhance the optical properties of the spin system by e.g. increasing the optical emission rate due to the Purcell Effect. Since this effect increases for decreasing thicknesses of the second layer 102, layer 102 should have a thickness of less than 10 µm, preferentially less than 1 µm.

Figure 4B:
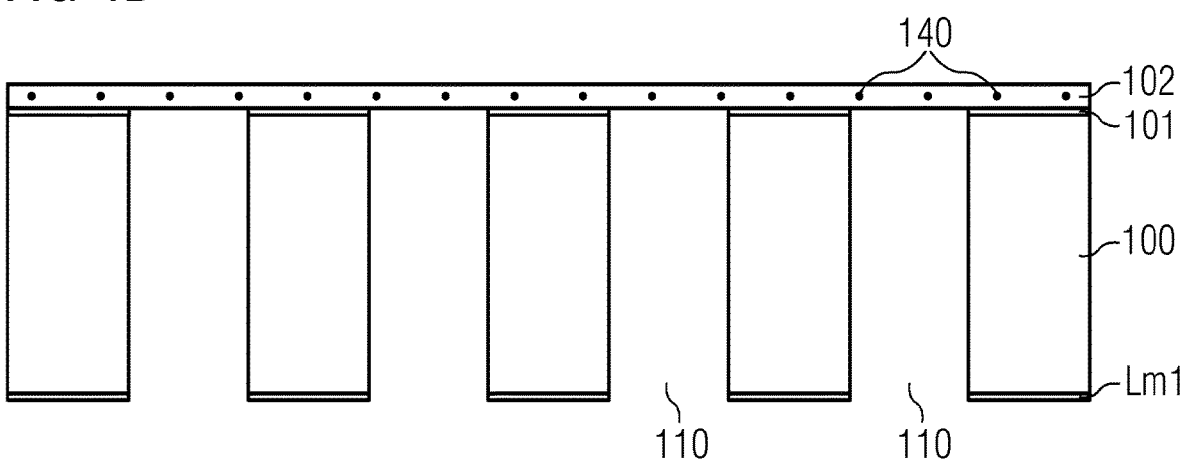
Figure 4C:
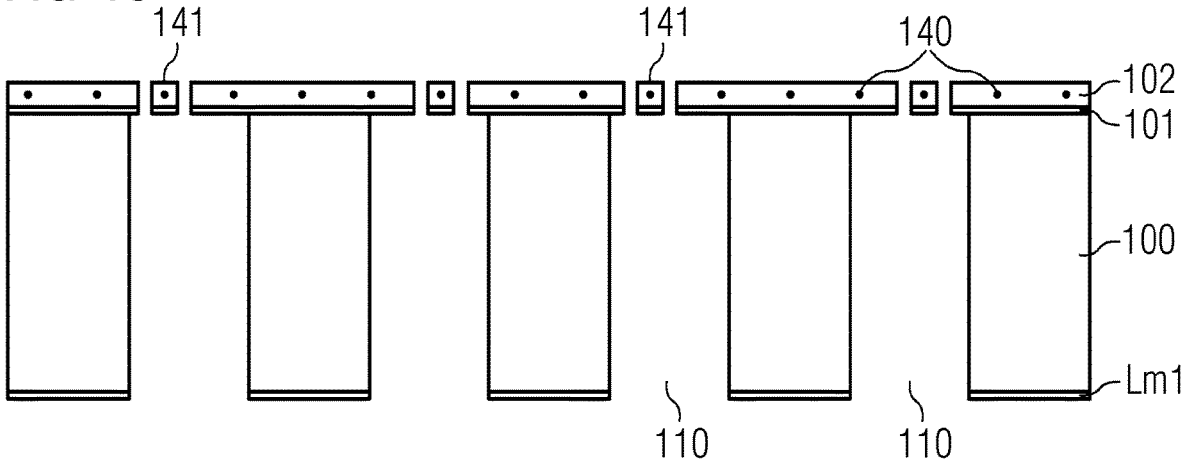

FIG. 4b shows a first intermediate fabrication step where a pattern of pits 110, initially generated by RIE in the additional layer Lm1, if present, is then extended thorough the full substrate and the layer 101 by mean of electrochemical etching. This technique allows a local selective full removal of the silicon carbide substrate 100 and the first layer 101, but it is blocked by the second etch stopper layer 102.

The system, i.e. the suspended membranes in the second layer 102, can be further processed, e.g. by realizing optical cavities around the spin-defects (see FIG. 4c) to further enhance the optical properties.

Figure 5A:
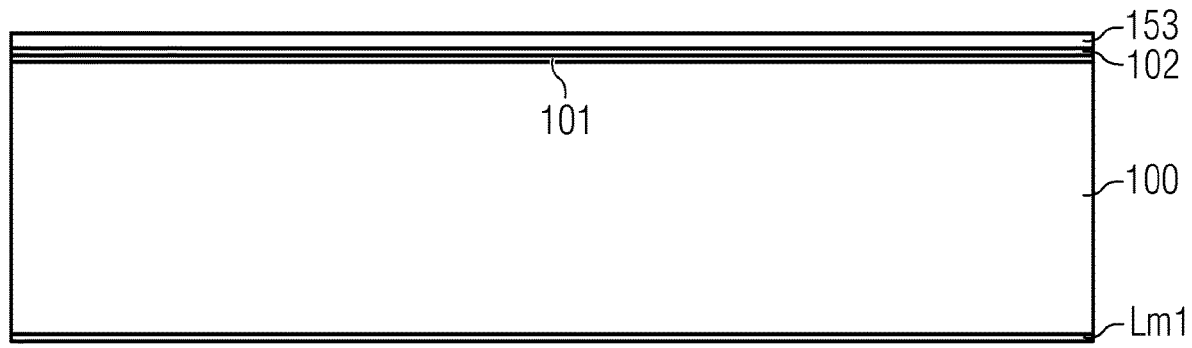
FIG. 5 an exemplary method for a monolithic wafer-level transfer-less fabrication of free-standing Graphene membranes on SiC substrates.

In a final embodiment, a wafer-level transfer-less fabrication of free-standing graphene membranes is realized. Referring to FIG. 5, the initial structure has a silicon carbide substrate 100, a first homoepitaxial layer 101 at least a second homoepitaxial layer 102 and an epitaxial graphene layer 153 on top of the second layer 102, all formed on a first or upper surface of the substrate, the embodiment can also have a homoepitaxial layer Lm1 formed on the second, or lower, surface of the silicon carbide substrate 100. The silicon carbide substrate 100 is a highly doped n+ layer. The first layer 101 has the same doping type of the substrate with, equal or higher, concentration. The second layer 102 has the same doping type of the first layer but lower concentration. The additional layer Lm1, if present, has a lower concentration than the SiC substrate 100.

Figure 5B:
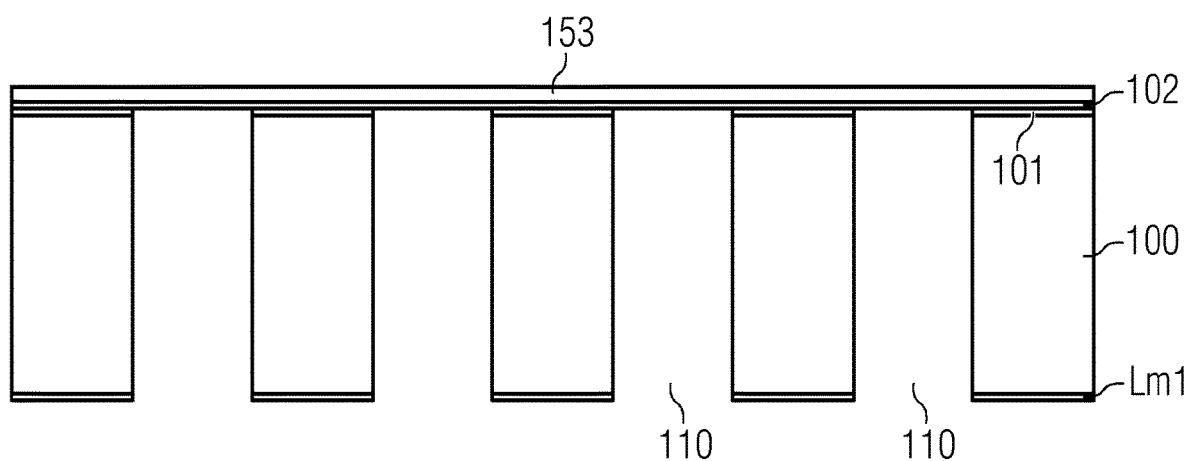

FIG. 5b shows a first intermediate fabrication step where a pattern of pits 110, initially generated by RIE in the additional layer Lm1, if present, is then extended thorough the full substrate and the first layer 101 by mean of electrochemical etching. This technique allows a local selective full removal of the silicon carbide substrate 100 and the first layer 101, but it is blocked by the second etch stop layer 102.

Figure 5C:
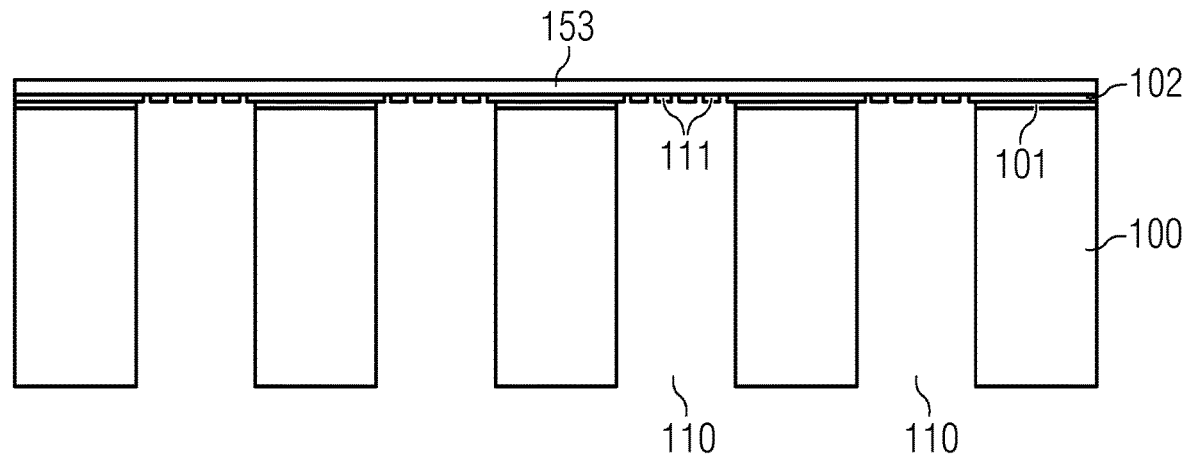

FIG. 5c shows a second fabrication step where the pattern of pits 110 is further etched by photo-electrochemical etching (PECE), similarly to what was tested in ref.[vii], to selectively remove portions of the second layer 102, generating a new pit structure 111 which allow release of the graphene membrane 153.

Figure 6:
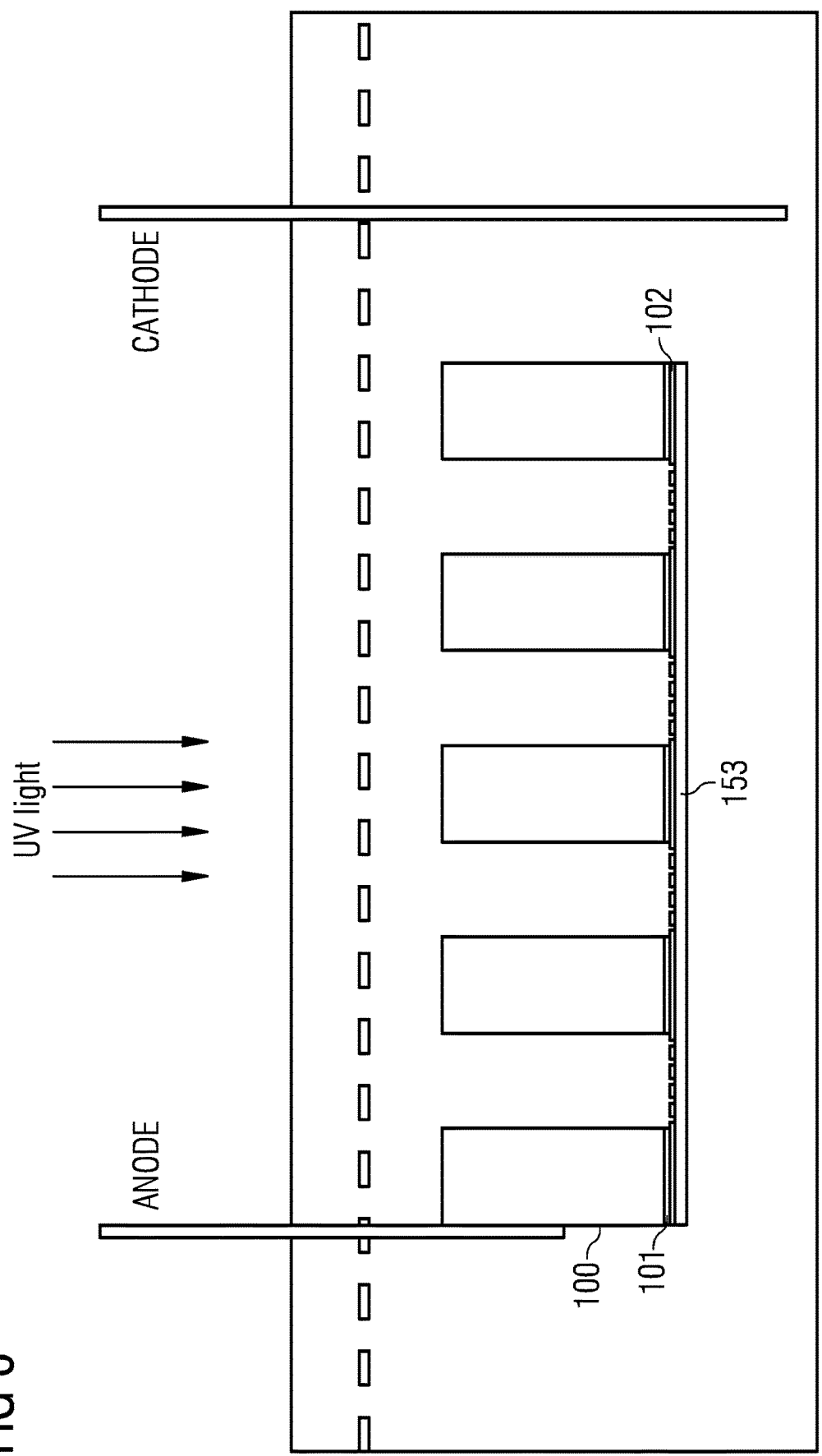
FIG. 6 an exemplary photo-electrochemical etching setup.

The PECE, as compared to the ECE process used to remove the silicon carbide substrate 100 and the first layer 101, has an important beneficial characteristic and a limiting one:

1. given the low applied electrical biased (<10V), it does not require isolation of the metal contacts (anode and cathode) from the solution. This allows for both sides of the Graphene/SiC system to be in direct contact with the etching solution (see FIG. 6) so that (i) there is not unbalanced pressure on the graphene membranes, which avoids mechanical breaking, (ii) even in the event of a break of a graphene membrane, the process can properly continue.
2. due to the used low electrical biases, it does not allow for sufficiently high etch rates, generally lower than ~5 µm/h. This in turn prevents the use of PECE for the full, wafer-level, etching of the ~370 µm SiC substrate in any reasonable processes time.

The proposed Graphene/SiC multilayered structure (FIG. 5a) and the specific consecutive combination of ECE and PECE allows for an industrially compatible transfer-less, wafer-level fabrication of free-standing graphene membranes on up to 200 mm SiC substrates, as compared to the ~3 mm sample used in scientific document [vii]. Furthermore, the possibility of realizing free-standing graphene membranes without transfer processes at wafer-level allows usage of standard microfabrication processes, e.g. lithographic steps and RIE, to further process the realized free-standing graphene membranes to fabricate e.g. gas, optical sensors or ultrafast transistors.

While the invention has been described in terms of the several specific embodiments, it is apparent that other forms could be adopted by one skilled in the art. For example, the etched pattern on the substrate could differ in appearance and construction from the embodiment shown in the figures, be used in combination with specific implanted doping structures (e.g. in SiC superjunctions) or appropriate materials could be substituted for those noted. Accordingly, it should be understood that the invention is not limited to the specific embodiments illustrated in the figures. It should also be understood that the phraseology and terminology employed above are for the purpose of disclosing the illustrated embodiments, and do not necessarily serve as limitations to the scope of the invention. Finally, while the appended claims recite certain aspects believed to be associated with the invention, they do not necessarily serve as limitations to the scope of the invention.

i) T. Tawara, T. Miyazawa, M. Ryo, M. Miyazato, T. Fujimoto, K. Takenaka, S. Matsunaga, M. Miyajima, A. Otsuki, Y. Yonezawa, T. Kato, H. Okumura, T. Kimoto and H. Tsuchida, "*Suppression of the Forward Degradation in 4H-SiC PiN Diodes by Employing a Recombination-Enhanced Buffer Layer*" Material Science Forum 897, 419 (2017)

ii) N. Piluso, A. Severino, R. Anzalone, M. A. Di Stefano, E. Fontana, M. Salanitri, S. Lorenti, A. Campione, P. Fiorenza, F. La Via "*Growth of 4H-SiC Epitaxial Layer through Optimization of Buffer Layer*" Material Science Forum 924, 84 (2018)

iii) B. J. Baliga, "*Fundamentals of Power Semiconductor Devices*", Springer iv) J. Choi, R. Puthenkovilakam, J. P. Chang, Appl. Phys. Lett. 86, 192101 (2005)
v) M. Kokal, "AlGaN/GaN MBE 2DEG Heterostructures: Interplay between Surface-, Interface and Device-Properties", PhD. Dissertation (2003)
vi) R. S. Pengelly, S. M. Wood, J. W. Milligan, S. T. Sheppard, and L. Pribble, IEEE Transactions on Microwave Theory and Techniques, 6, (2012)
vii) D. Waldmann, B. Butz, S. Bauer, J. M. Englert, J. Jobst, K. Ullmann, F. Fromm, M. Ammon, M. Enzelberger, A. Hirsch, S. Maier, P. Schmuki, T. Seyller, E. Spiecker, and H. B. Weber, "Robust Graphene Membranes in a Silicon Carbide Frame" ACS Nano, 7 4441 (2013)

The invention claimed is:

1. A method of forming at least a part of a power semiconductor device, the method comprises:
homoepitaxially forming at least two silicon carbide (SiC) layers on a first side of a silicon carbide (SiC) substrate, wherein the at least two SiC layers include a first layer, hereinafter referred to as a buffer layer, on the first side of the silicon carbide substrate and having a same doping type as the silicon carbide substrate and a doping concentration being equal to or greater than $10^{17}$ cm$^{-3}$ in order to increase a quality of at least one subsequent SiC layer, wherein the at least two SiC layers include a second layer, hereinafter referred to as an etch stopper layer, being deposited on the buffer layer and having a same doping type as the buffer layer but a lower doping concentration in order to block a trenching process; and
forming a pattern of pits on a second side of the silicon carbide substrate, wherein the pattern of pits, being obtained by electrochemical etching, and extends at least completely thorough the silicon carbide substrate and the buffer layer.

2. The method according to claim 1, which further comprises setting the doping concentration of the buffer layer to be equal to or greater than $10^{18}$ cm$^{-3}$.

3. The method according to claim 1, which further comprises setting the doping concentration of the buffer layer to be equal to or greater than the SiC substrate.

4. The method according to claim 1, which further comprises:
forming an additional layer on the second side of the silicon carbide substrate, the additional layer having a lower doping concentration than the silicon carbide substrate and acting as a mask for the electrochemical etching; and
forming the pattern of pits through the additional layer by reactive ion etching (RIE), whereas the pattern of pits extending completely thorough at least the silicon carbide substrate and the buffer layer is obtained through the electrochemical etching (ECE).

5. The method according to claim 4, which further comprises homoepitaxially forming at least two further silicon carbide layers on top of the buffer layer and the etch stopper layer on the first side of the silicon carbide substrate, wherein the two further silicon carbide layers define a third layer, hereinafter referred to as an Ohmic contact improver layer, being of a same doping type as the etch stopper layer but with a higher doping concentration in order to reduce an electrical contact resistance of a metal-to-SiC interface, and a fourth layer, hereinafter referred to as a drift layer, being of a same doping type as the silicon carbide substrate but having a lower doping concentration in order to sustain high electric fields in high power devices.

6. The method according to claim 5, which further comprises further extending the pits by reactive ion etching (RIE) or photo-electrochemical etching to extend completely through the additional layer, the silicon carbide substrate, the buffer layer, the etch stopper layer and partially through the Ohmic contact improver layer.

7. The method according to claim 6, which further comprises fabricating an Ohmic metal at least within the pits to define low-resistance back contacts.

8. The method according to claim 7, which further comprises fabricating a Schottky metal on top of the drift layer to realize a SiC Schottky diode.

9. The method according to claim 7, which further comprises:
forming at least one source region with a same doping type as the drift layer above the drift layer;
forming at least one base region with a different doping type than the drift layer between the at least one source region and the drift layer;
forming a dielectric region above the drift layer; and
forming a gate contact above the dielectric region and above at least a portion of the at least one base region to realize a SiC based metal-oxide-semiconductor field-effect transistor.

10. The method according to claim 1, which further comprises forming at least two further silicon carbide layers on top of the buffer layer and the etch stopper layer on the first side of the silicon carbide substrate, wherein the at least two further SiC layers include a third layer being an Ohmic contact improver layer having a different doping type and a higher doping concentration than the second layer, the third layer being used both to reduce an electrical contact resistance of a metal-to-SiC interface and as minority carriers injector to further reduce a specific-on resistance $R_{on}$ of the power semiconductor device, and a fourth layer as a drift layer or as an electric field stopper being of a same doping type and having a lower doping concentration as the silicon carbide substrate, the fourth layer being used to sustain high electric fields in high power devices or as an electric field stopper.

11. The method according to claim 10, wherein the pits are further extended by reactive ion etching (RIE) or photo-electrochemical etching to extend completely through the silicon carbide substrate, the buffer layer, the etch stopper layer and partially through the Ohmic contact improver layer and the minority carriers injector.

12. The method according to claim 11, which further comprises fabricating an Ohmic metal at least within the pits to define low-resistance back contacts.

13. The method according to claim 12, which further comprises:
forming at least one source region with a same doping type as the drift layer above the drift layer;
forming at least one base region with a different doping type than the drift layer between the at least one source region and the drift layer;
forming a dielectric region above the drift layer; and
forming a gate contact above the dielectric region and above at least a portion of at least the base region to realize a SiC based an insulated-gate bipolar transistor.

14. The method according to claim 1, which further comprises forming at least one further nitride containing layer on-top of the top-most silicon carbide layer.

15. The method according to claim 14, which further comprising selecting the at least one further nitride-containing layer from the group consisting of AlGaN, AlN, and GaN.

16. The method according to claim 15, which further comprises further extending the pits by reactive ion etching (RIE), photo-electrochemical etching or a combination of them to extend completely through at least the silicon carbide substrate, the buffer layer and the etch stopper layer.

17. The method according to claim 1, wherein the etch stopper layer has spin-active point-like defects located at least within the pits.

18. The method according to claim 17, wherein the second layer is further etched to realize optical cavities around the spin-active point-like defects, thus further enhancing their optical properties.

19. The method according to claim 1, which further comprises forming at least one graphene layer at least partially on top of the second layer.

20. The method according to claim 19, wherein:
a first pattern of the pits is further extended by generating a second pattern of the pits, realized by usage of photo-electrochemical etching;
the first pattern of the pits extending through the silicon carbide substrate and the first layer and the second pattern of the pits extending fully at least through the second layer.

\* \* \* \* \*